United States Patent [19]

Eden et al.

[11] Patent Number: 4,843,030

[45] Date of Patent: Jun. 27, 1989

[54] SEMICONDUCTOR PROCESSING BY A COMBINATION OF PHOTOLYTIC, PYROLYTIC AND CATALYTIC PROCESSES

[75] Inventors: J. Gary Eden, Mahomet; Kevin K. King, Urbana; Viken Tavitian, Champaign, all of Ill.

[73] Assignee: Eaton Corporation, Cleveland, Ohio

[21] Appl. No.: 126,891

[22] Filed: Nov. 30, 1987

[51] Int. Cl.$^4$ ................ H01L 21/306; H01L 21/26; H01L 21/265

[52] U.S. Cl. .............................. 437/88; 148/DIG. 48; 148/DIG. 58; 148/DIG. 71; 148/DIG. 93; 156/612; 427/53.1; 437/108; 437/112; 437/131; 437/173; 437/931; 437/949

[58] Field of Search ............ 118/50.1, 620, 715; 148/DIG. 7, 22, 48, 58, 71, 90, 93, 169; 156/610–614; 427/53.1, 54.1; 437/19, 85, 87, 88, 106, 111, 112, 131, 173, 174, 908, 939, 946, 942, 949

[56] References Cited

U.S. PATENT DOCUMENTS

| | | | |
|---|---|---|---|
| 4,183,780 | 1/1980 | McKenna et al. | 156/643 |
| 4,260,649 | 4/1981 | Denison | 427/53.1 |
| 4,292,093 | 7/1981 | Ownby et al. | 148/1.5 |
| 4,340,617 | 7/1982 | Deutsch et al. | 427/53.1 |
| 4,370,175 | 1/1983 | Levatter | 148/1.5 |
| 4,372,989 | 5/1983 | Menzel | 427/53.1 |
| 4,427,723 | 1/1984 | Swain | 427/53.1 |
| 4,435,445 | 3/1984 | Allred et al. | 427/54.1 |
| 4,495,218 | 1/1985 | Azuma et al. | 427/53.1 |
| 4,505,949 | 3/1985 | Jelks | 427/38 |
| 4,509,451 | 4/1985 | Collins et al. | 118/50.1 |
| 4,529,474 | 7/1985 | Fujiyama et al. | 156/643 |
| 4,529,475 | 7/1985 | Okano et al. | 118/50.1 |
| 4,529,617 | 7/1985 | Chenevas-Paule et al. | 427/53.1 |
| 4,540,466 | 9/1985 | Nishizawa | 156/643 |
| 4,579,609 | 4/1986 | Reif et al. | 437/946 |
| 4,579,750 | 4/1986 | Bowen et al. | 427/53.1 |
| 4,590,091 | 5/1986 | Rogers, Jr. et al. | 437/173 |
| 4,624,736 | 11/1986 | Gee et al. | 118/50.1 |
| 4,649,059 | 3/1987 | Eden et al. | 437/173 |
| 4,655,849 | 7/1987 | Schachameyer et al. | 148/1.5 |
| 4,668,304 | 5/1987 | Schachameyer et al. | 148/1.5 |
| 4,670,063 | 6/1987 | Schachameyer et al. | 148/1.5 |
| 4,670,064 | 6/1987 | Schachameyer et al. | 148/1.5 |
| 4,681,640 | 7/1987 | Stanley | 427/53.1 |
| 4,685,976 | 8/1987 | Schachameyer et al. | 437/173 |
| 4,732,793 | 3/1988 | Itoh | 427/53.1 |

OTHER PUBLICATIONS

E. R. Austin and F. W. Lampe, J. Phys. Chem. 81, 1134 (1977).
W. T. Anderson, Jr., A. Christou and J. E. Davey, J. Appl. Phys. 49, 2998 (1978).
G. Eden, R. Burnham, L. F. Champagne, T. Donohue, N. Djeu, IEEE Spectrum, Apr., 1979, pp. 50-59.
J. Nishizawa, Y. Kokubun, H. Shimawaki and M. Koike, J. Electrochem, Soc. 132, 1939 (1985).
L. N. Hall, J. Electrochem, Soc. 119, 1593 (1972).
G. R. Smith, and W. A. Guillory, J. Chem. Phys. 56, 1423 (1972).
Hanabusa et al, Appl. Phys. Letts. 35 (1979) 626.
J. E. Greene, K. C. Cadien, D. Lubben, G. A. Hawkins, G. R. Erikson and J. R. Clarke, Appl. Phys. Lett. 39, 232 (1981).
R. W. Andreatta, C. C. Abele, J. F. Osmundsen, J. G. Eden, D. Lubben and J. E. Greene, Appl. Phys. Lett. 40, 183 (1982).
Turner et al in Proc. 4th European—Photovoltaic Solar (List continued on next page.)

Primary Examiner—Brian E. Hearn
Assistant Examiner—William Bunch
Attorney, Agent, or Firm—Andrus, Sceales, Starke & Sawall

[57] ABSTRACT

A semiconductor processing method is provided for growing a semiconductor film from a semiconductor-bearing gas on a substrate at a substrate temperature below the pyrolytic threshold of the gas. The gas is photodissociated to a collisionally stable species which migrates and travels in the gas phase the entire distance to the substrate, surviving hundreds of collisions, and is pyrolyzed at the surface of the substrate and forms several monolayers of semiconductor material which is substantially more catalytically active than the substrate and which subsequently catalyzes decomposition of the gas.

22 Claims, 5 Drawing Sheets

OTHER PUBLICATIONS

Energy Conf. Stresa, Italy, Reidel, 1982, pp. 427–431.

R. M. Osgood, Jr., Ann. Rev. Phys. Chem. 34, 77 (1983).

J. G. Eden, J. E. Greene, J. F. Osmundsen, D. Lubben, C. C. Abele, S. Gorbatkin and H. D. Desai, Mat. Res. Soc. Symp. Proc. 17, 185 (1983).

R. Solanki, W. H. Ritchie and G. J. Collins, Appl. Phys. Lett. 43, 454 (1983).

P. K. Boyer, C. A. Moore, R. Solanki, W. K. Ritchie, G. A. Roch and G. J. Collins, Mat. Res. Soc. Cymp. Proc. 17, 119 (1983).

T. F. Deutsch, D. J. Silversmith and R. W. Mountain, Mat. Res. Soc. Symp. Proc. 17, 129 (1983).

H. Kräutle, P. Roetgen and H. Beneking, J. Cryst. Growth 65, 439 (1983).

W. Roth, H. Kräutle, A. Krings and H. Beneking, Mat. Res. Soc. Symp. Proc. 17, 193 (1983).

D. Bauerle, "Laser Induced Chemical Vapor Deposition", *Surface Studies With Lasers*, Proceedings of the International Conference Mauterndorf, Austria, Mar. 9–11, 1983, Editors Aussenegg et al, Springer-Verlag, Berlin, 1983 pp. 178–188

Ibbs et al., "Laser Doping of Silicon by the Dissociation of Metal Alkys", ibid, 1983, pp. 189–192.

S. J. C. Irvine, J. B. Mullin and J. Tunnicliffe, J. Cryst. Growth 68, 1988 (1984).

V. M. Donnelly, M. Geva, J. Long and R. F. Karlicek, Appl. Phys. Lett. 44, 951 (1984).

P. K. Boyer, K. A. Emery, H. Zarnani and G. J. Collins, Appl. Phys. Lett. 45, 979 (1984).

J. C. Bravman and R. Sinclair, Journal of Electron Microsc. Tech. 1, 53 (1984).

N. Putz, H. Heinecke, E. Veuhoff, G. Arens, M. Heyen, H. Luth and P. Balk, J. Cryst. Growth 68, 194 (1984).

J. Y. Tsao and D. J. Ehrich, Appl. Phys. Lett. 45, 617 (1984).

D. B. Geohegan and J. G. Eden, Appl. Phys. Lett. 45 (10), (1984).

V. M. Donnelly, D. Brasen, A. Appelbaum and M. Geva, J. Appl. Phys. 58, 2022 (1985).

S. J. C. Irvine, J. Giess, J. B. Mullin, G. W. Blackmore and O. D. Dosser, J. Vac. Sci. Technol. B 3, 1450 (1985).

K. Suzuki, D. Lubben and J. E. Greene, J. Appl. Phys. 58, 979 (1985).

H. Ando, H. Inuzuka, M. Konagai and K. Takahashi, J. Appl. Phys. 58, 802 (1985).

K. Nakamura, N. Masaki, S. Sato and K. Shimokoshi, J. Chem. Phys. 83, 4504 (1985).

J. F. Osmundsen, C. C. Abele and J. G. Eden, J. Appl. Phys. 57, 2921 (1985).

F. A. Houle, Appl. Phys. A. 41, 315–330 (1986).

S. Nishida, T. Shiimoto, A. Yamada, S. Karasawa, M. Konagai and K. Takahashi, Appl. Phys. Lett. 49, 79 (1986).

J. Gary, Eden, IEEE Circuits and Devices Magazine, Jan. 1986; pp. 18–24.

R. N. Bicknell, N. C. Giles and J. F. Schetzina, Appl. Phys. Lett. 49, 1735 (1986).

S. M. Bedair, J. K. Whisnant, N. H. Karam, D. Griffis, N. A. El-Masry and H. H. Stadelmaier, J. Cryst. Growth 77, 229 (1986).

N. H. Karam, N. A. El-Masry and S. M. Bedair, Appl. Phys. Lett. 49, 880 (1986).

G. S. Higashi and C. G. Fleming, Appl. Phys. Lett. 48, 1051 (1986).

T. Taguchi, J. Morikawa, Y. Hiratsuka and K. Toyoda, Appl. Phys. Lett. 49, 971 (1986).

K. K. King, V. Tavitian, D. B. Geohegan, E. A. P. Cheng, S. A. Piette, F. J. Scheltens and J. G. Eden, Matt. Res. Soc. Symp. Proc. 75, 189 (1987).

V. M. Donnelly, V. R. McCrary, A. Appelbaum, D. Brasen and W. P. Lowe, J. Appl. Phys. 61, 1410 (1987).

TOP VIEW

SIDE VIEW

SEMICONDUCTOR PROCESSING BY A COMBINATION OF PHOTOLYTIC, PYROLYTIC AND CATALYTIC PROCESSES

The invention was made with government support under contract F49620-85-C-0141 awarded by the Air Force Office of Sponsored Projects, and contract NSF DMR 83-16981 awarded by the National Science Foundation. The government has certain rights in the invention.

BACKGROUND AND SUMMARY

The invention relates to a semiconductor processing technique for growth of a semiconductor film on a substrate.

In accordance with the invention, a semiconductor film is grown on a substrate at temperatures below the pyrolytic threshold of a semiconductor-bearing gas. The gas is photodissociated to a species which pyrolyzes at the surface of the substrate to form several monolayers of semiconductor material which subsequently catalyze the decomposition of the gas. The stable species diffuses in the gas phase from the region illuminated by the laser to the substrate's surface. The photodissociation occurs at a point spaced above the substrate by a distance which can range from one to >100 mean free paths for the collision of the photodissociated species with the background gas. In other words, the photodissociated species of the gas is stable against hundreds of collisions and lives long enough to reach the substrate. The substrate is heated to a temperature greater than the pyrolytic threshold of the photoproduced species and less than the pyrolytic threshold of the gas.

In accordance with the invention, the growth of semiconductor films by chemical vapor deposition (CVD) can be initiated ("triggered") or sustained at temperatures well below those normally necessary. The initial part of the process is photochemical and involves laser irradiation of a gas above the substrate. The laser radiation photodissociates or photoionizes a semiconductor-bearing molecule in the gas phase. The photofragments migrate to the substrate, at which point some decompose, leaving behind several monolayers. These monolayers are catalytically more active than the substrate itself. Conventional CVD then proceeds once these few monolayers are grown, even though the substrate temperature is below that normally required to initiate CVD. The laser radiation is needed only to trigger such low temperature growth process. Film growth continues after the laser is turned off.

DESCRIPTION OF THE INVENTION

Preliminary Description

Figure 1:
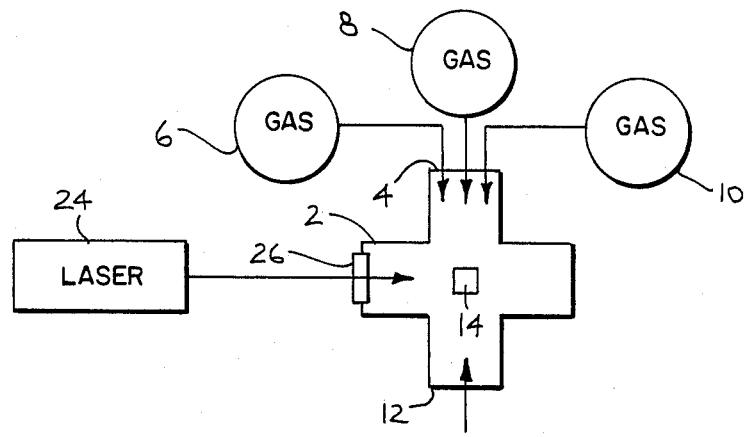
FIG. 1 is a top view schematically illustrating a semiconductor processing reactor chamber for the semiconductor processing method in accordance with the invention.
Figure 2:
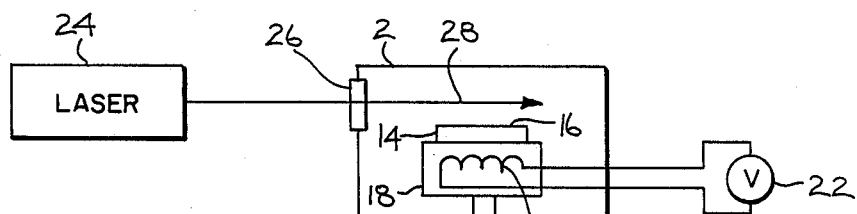
FIG. 2 is a side view of the chamber of FIG. 1.

FIG. 1 shows a top view of a reactor chamber 2 for receiving various gases through ports 4. Gas source 6 supplies an etchant-bearing gas such as hydrogen chloride (HCl). Gas source 8 provides an inert buffer rare gas such as helium (He) or argon (Ar). Gas source 10 supplies a semiconductor-bearing gas such as germane ($GeH_4$) or silane ($SiH_4$) The gases are exhausted at vent port 12. A semiconductor substrate 14 having a top planar surface 16 is provided on pedestal 18 in chamber 12, FIG. 2. The pedestal is provided with a resistance heater 20 supplied with current from voltage source 22 for heating substrate 14. Laser radiation is provided by an excimer pulsed ultraviolet laser 24 introducing laser radiation through window 26 into chamber 2 along a path 28 parallel to top planar surface 16 and spaced thereabove.

Semiconductor substrate 14 is initially precleaned external of chamber 2 by a conventional degreasing step to chemically clean the substrate, for example the RCA process as known in the art. Substrate 14 is then placed on pedestal 18 which is a ceramic material. A rare (inert) gas such as helium or argon is then flowed across substrate 14 from source 8 to remove moisture and to keep the reactor chamber 2 clean. During this time, the temperature of substrate 14 is gradually raised by resistance heater 20. Together with the rare gas from soure 8, 5% by weight hydrogen chloride gas is introduced from source 6 to etch substrate 14 for one to five minutes to etch away the approximately 20 angstroms, 4 or 5 monolayers, of oxide typically accumulated when transferring substrate 14 from a pre-cleaning RCA chemical process to chamber 2. The etch removes the oxide from the top surface of substrate 14 to expose virgin semiconductor material. The hydrogen chloride gas from source 6 is then terminated, and a semiconductor-bearing gas is introduced from source 10 at a partial pressure of about 1 Torr. The buffer rare gas from source 8 is continued, and the total gas pressure from sources 8 and 10 is about 30 Torr. In one particular growth run, germane (GeH$_4$) was provided from source 10 at a pressure of 1 Torr and argon gas was provided from source 8 to provide a total pressure of 30 Torr. In various alternatives, it was found that the pressure from gas source 10 could be varied up to about 10 Torr, but should not be varied below about 0.5 Torr, otherwise the growth rate suffered, to be described. The flow rate of the gas from sources 8 and 10 is preferably about 100 standard cubic centimeters per minute.

Laser radiation from source 24 is then initiated to provide a photolytic reaction. Because the reaction is photochemical, a wavelength shorter than 277 nanometers is required. It has been observed that growth occurs at 248 nanometers and at 193 nanometers, provided by krypton floride and argon floride excimer pulsed ultraviolet lasers, respectively. In the particular growth run noted above with monogermane (GeH$_4$), a krypton floride excimer pulsed ultraviolet laser was used at a frequency of 40 Hz with a 20 nanosecond pulse width and a peak intensity of about 2 megawatts per square centimeter, and with a peak energy of about 150 millijoules per pulse. It has been found that the growth rates of the semiconductor material are on the order of one monolayer per second. The growth time typically ranges from 20 to 50 minutes. The germane flow from source 10 is then terminated, and the reactor chamber 2 is purged with continued flow from gas source 8.

A significant aspect of the invention is the particular combinational photochemistry. A semiconductor film is grown from a semiconductor-bearing gas from source 10 on substrate 14 at a substrate temperature below the pyrolytic threshold of the gas from source 10. Laser 24 photodissociates such gas to a species which pyrolyzes at the surface 16 of substrate 14 and forms several monolayers of semiconductor material which is more catalytically active than substrate 14 itself and which catalyzes decomposition of gas from source 10. The noted species is transported entirely in the gas phase the full distance from the point of photodissociation to the substrate surface 16. The point of photodissociation of the gas at laser beam 28 is one to two millimeters above the top surface 16 of the substrate, which is at least two to three orders of magnitude greater than the mean free collision path of molecules in the germane gas from source 10. The photodissociated species is stable against (up to) hundreds of collisions and is transported entirely in the gas phase the full distance from the point of photodissociation at laser beam 28 to substrate surface 16 and lives long enough to reach such substrate surface. The germane gas from source 10 is otherwise inactive relative to substrate 14.

The laser intensity, gas pressure and gas flow rate are critical, and are selected such that the gas is photochemically converted to the noted collisionally stable species by multi-photon excitation wherein each molecule of the gas absorbs more than one photon, to be described. The laser radiation triggers the photochemical conversion of the gas but is not necessary to the catalyzed decomposition of the gas by the catalytic species, such that the layer of semiconductor material continues to grow even if laser radiation is terminated.

In the preferred embodiment, it is critical that the gas pressure be sufficiently low and the laser intensity sufficiently high such that two photons are absorbed simultaneously, rather than absorption of a single photon, to produce either digermane (Ge$_2$H$_6$) or atomic germanium (Ge) each of which is stable against collisions and will migrate the full distance to the substrate's surface.

Figure 3:
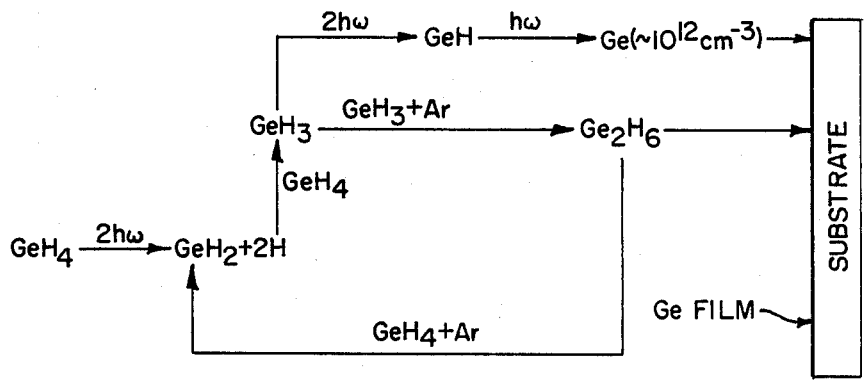
FIG. 3 is a flow diagram of the photochemical and collisional mechanisms dominating the chemistry of the semiconductor film growth. Species next to a reaction arrow is the second reactant.
Figure 11:
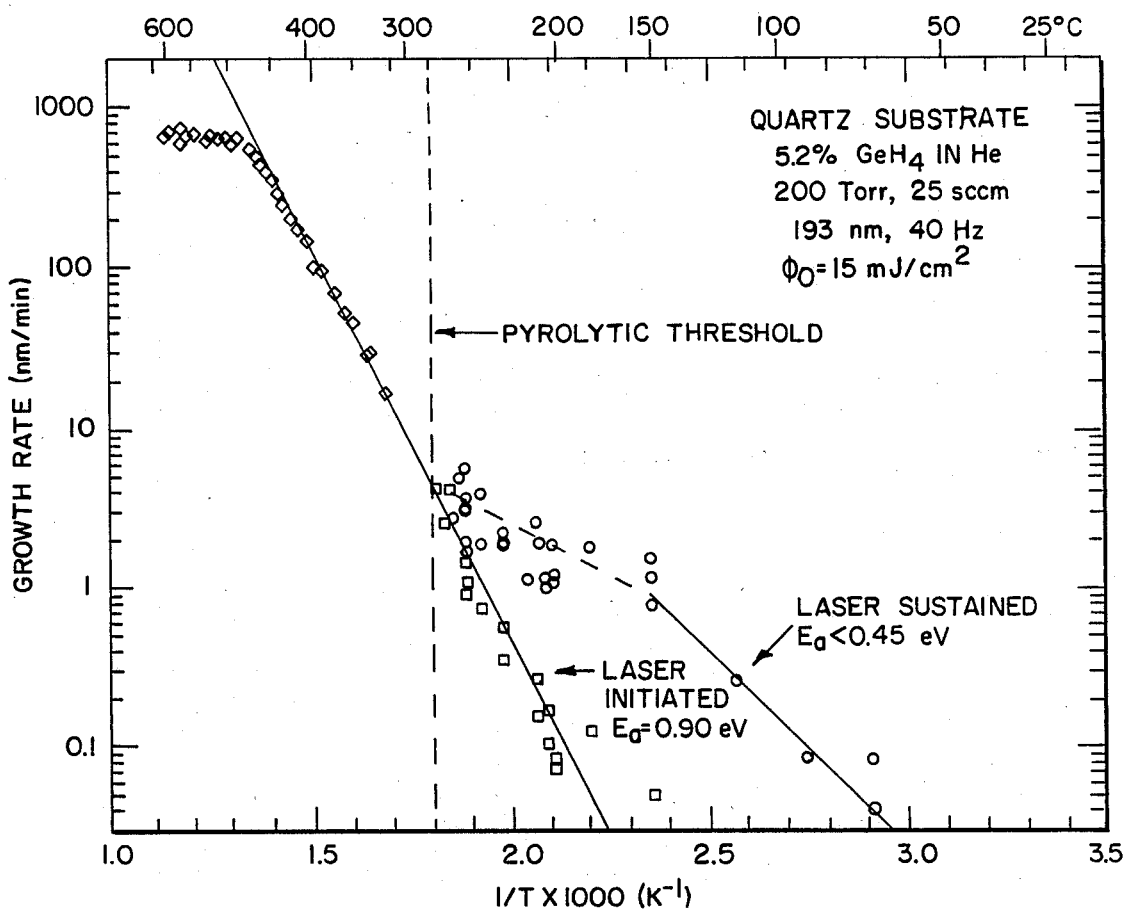
FIG. 11 is an Arrhenius plot for the growth of Ge films on $SiO_2$ (quartz) for substrate temperatures in the range $300 \leq T_S \leq 873$ K. Below the pyrolytic temperature (T=553K), two modes of film growth (laser initiated and laser sustained) are available. In acquiring all of the data in which the UV laser was involved, the height of the beam center above the substrate was 2.2 mm.

FIG. 3 is a reproduction of FIG. 11 of "Activation Energy and Spectroscopy of the Growth of Germanium Films by Ultraviolet Laser-Assisted Chemical Vapor Deposition", Osmundsen et al, *Journal of Applied Physics,* Volume 57, No. 8, Part 1, 15 April 1985, pages 2921-2930. FIG. 3 shows the flow diagram of photochemical and collisional mechanisms dominating the chemistry of germanium film growth. Species next to a reaction arrow is the second reactant.

It has also been found that laser radiation from source 24 triggers the photochemical conversion of the gas but is not necessary to the catalyzed decomposition of the gas by the catalytic species, and that the semiconductor material continues to be formed even if laser radiation from source 24 is terminated. The stable by-product (digermane—Ge$_2$H$_6$) of the UV photolysis of monogermane has a pyrolytic threshold less than that of the germane. Substrate 14 is heated by heater 20 to a temperature greater than the pyrolytic threshold of the noted stable species and less than the pyrolytic threshold of the germane gas (GeH$_4$), such that the noted stable species is photochemically converted from the germane gas by laser radiation from laser 24 and gas phase transported without pyrolytic reaction to substrate 14, whereafter the noted stable species is pyrolyzed by substrate 14 to the noted catalytic species.

As above noted, pressure and flow rate of the gas is critical. The partial pressure of the semiconductor-bearing gas must be sufficient to provide enough semiconductor-bearing molecules for photodissociation and transport without pyrolytic reaction through the entire distance to the substrate.

Another significant aspect of the invention is multi-photon excitation, wherein each molecule of the gas absorbs more than one photon, Osmundsen et al. above cited. Upon radiation of the gas from sources 8 and 10 by laser 24, a glow is observed which varies in radiation intensity as the square of the laser intensity. In accordance with optical perturbation theory, such quadratic relationship indicates two photon excitation. Futhermore, no growth is observed at 277 nanometers, but growth is observed at 248 nanometers. 248 nanometers corresponds to a 5 electron volt photon, which is half the energy required to dissociate monogermane with a single photon. These two pieces of evidence are conclusive that the gas is being photochemically converted by a two photon excitation process.

In a single photon excitation process, germane (GeH$_4$) is converted to GeH$_3$+hydrogen, which is not stable enough to live long enough to get to the surface 16 of the substrate. In a two photon excitation process, germane becomes GeH$_2$ which has a collision lifetime which is very short and rapidly converts to digermane (Ge$_2$H$_6$) or is dissociated to yield atomic germanium (Ge). Both digermane and germanium are relatively stable and will live long enough to reach surface 16 of substrate 14. Digermane and atomic germanium are the only sufficiently stable photochemical by-products of germane. It has been found that laser intensity and gas pressure are critical, and the laser intensity must be high enough and the gas pressure low enough to produce the desired results.

Detailed Description

Epitaxial Ge films have been grown on [100] GaAs by laser photochemical vapor deposition (LPVD) for substrate temperatures ($T_s$) in the $285 \leq T_s \leq 400°$ C. interval. Films $400 \geq 800$ A thick were grown at rates up to $\sim 1$ Å-s$^{-1}$ (4–6 nm/min) by photodissociating GeH$_4$ in He/5% GeH$_4$ gas flows with an ArF (193 nm) laser and parallel geometry (i.e., laser beam passes above and parallel to substrate). The quality of the Ge/GaAs heterointerfaces has been examined by plan view and cross-sectional transmission electron microscopy (TEM). Convergent beam electron diffraction, selected area diffraction patterns and lattice images show the LPVD films to be epitaxial whereas films grown in the absence of ultraviolet laser radiation (i.e., by conventional CVD) are amorphous ($T_s=305°$ C.) or heavily-defected polycrystalline ($T_s=415°$ C.). Epitaxy apparently hinges on the laser production of Ge atoms (or Ge$_2$H$_6$) in the gas phase which subsequently diffuse to the substrate without suffering (on average) collisions with background GeH$_4$.

The field of laser photochemical vapor deposition (LPVD) was born in the late 1970's amid considerable optimism regarding its potential for growing films at temperatures lower than those accessible to conventional growth techniques. Since that time, most of the effort in this area has focussed on the deposition of metals by photodissociating a precursor polyatomic molecule. For a review of early work in the field, see R. M. Osgood, Jr., Ann. Rev. Phys. Chem. 34, 77 (1983). Much less is known of the feasibility of growing device quality epitaxial semiconductor films, F. A. Houle, Appl. Phys. A 41, 315–330 (1986). Early work with the elemental semiconductors involved the growth of polycrystalline Ge (and to a lesser extent, Si) films on (100) NaCl, SiO$_2$ and 1102 sapphire, R. W. Andreatta, C. C. Abele, J. F. Osmundsen, J. G. Eden, D. Lubben and J. E. Greene, Appl. Phys. Lett. 40, 183 (1982), and J. G. Eden, J. E. Greene, J. F. Osmundsen, D. Lubben, C. C. Abele, S. Gorbatkin and H. D. Desai, Mat. Res. Soc. Symp. Proc. 17, 185 (1983), at substrate temperatures ($T_s$) down to 300° K. More recently, Nishida et. al., S. Nishida, T. Shiimoto, A. Yamanda, S. Karasawa, M. Konagai and K. Takahashi, Appl. Phys. Lett. 49, 79 (1986) have grown epitaxial Si films at 200° C. by irradiating Si$_2$H$_6$/SiH$_2$F$_2$/H$_2$ gaseous mixtures with a low pressure Hg lamp ($\sim 30$ mW-cm$^{-2}$).

Among the compound semiconductors, crystalline InP and polycrystalline GaAs have been grown by photodissociating mixtures of Column III and Column V alkyls with excimer laser radiation, V. M. Donnelly, M. Geva, J. Long and R. F. Karlicek, Appl. Phys. Lett. 44, 951 (1984), V. M. Donnelly, D. Brasen, A. Appelbaum and M. Geva, J. Appl. Phys. 58, 2022 (1985), V. M. Donnelly, V. R. McCrary, A. Appelbaum, D. Brasen and W. P. Lowe, J. Appl. Phys. 61, 1410 (1987). Also, Irvine and co-workers, S. J. C. Irvine, J. B. Mullin and J. Tunnicliffe, J. Cryst. Growth 68, 188 (1984), S. J. C. Irvine, J. Giess, J. B. Mullin, G. W. Blackmore and O. D. Dosser, J. Vac. Sci. Technol. B3 1450 (1985), have reported high quality II-VI films (HgTe, HgCdTe) that were grown by Hg photosensitization, again utilizing a resonance lamp. All of these previous experiments involved illuminating the surface with visible or UV radiation from the optical source and, in serveral cases, J. G. Eden, J. E. Greene, J. F. Osmundsen, D. Lubben, C. C. Abele, S. Gorbatkin and H. D. Desai, Mat. Res. Soc. Symp. Proc. 17, 185 (1983), V. M. Donnelly, M. Geva, J. Long and R. F. Karlicek, Appl. Phys. Lett. 44, 951 (1984), V. M. Donnelly, D. Brasen, A. Appelbaum and M. Geva, J. Appl. Phys. 58 2022 (1985), V. M. Donnelly, V. R. McCrary, A. Appelbaum, D. Brasen and W. P. Lowe, J. Appl. Phys. 61, 1410 (1987), transient heating of the substrate and growing film played a significant or dominant role in the formation of crystalline material. Aside from the early studies of Collins and co-workers, R. Solanki, W. H. Ritchie and G. J. Collins, Appl. Phys. Lett. 43, 454 (1983), P. K. Boyer, C. A. Moore, R. Solanki, W. K. Ritchie, G. A. Roche and G. J. Collins, Mat. Res. Soc. Symp. Proc. 17, 119 (1983), P. K. Boyer, K. A. Emery, H. Zarnani and G. J. Collins, Appl. Phys. Lett. 45, 979 (1984) and Deutsch et. al., T. F. Deutsch, D. J. Silversmith and R. W. Mountain, Mat. Res. Soc. Symp. Proc. 17, 129 (1983), in depositing compound insulators (Al$_2$O$_3$, SiO$_2$, Si$_3$N$_4$), few LPVD experiments have been carried out in parallel geometry.

The ability of visible or ultraviolet (UV) lasers to selectively produce (in situ) transient atomic or molecular species that are not normally present in a conventional CVD or MBE reactor (thus allowing the growth conditions to be altered) has significant implications for the growth of interfaces whose metallurgical and electrical characteristics are critically dependent upon the processing temperature. Considering the Ge/GaAs heteroepitaxial system, for example, epitaxial Ge films have been grown on GaAs by a variety of techniques (laser recrystallization, evaporation, etc.), K. Suzuki, D. Lubben and J. E. Greene, J. Appl. Phys. 58, 979 (1985), W. T. Anderson, Jr., A. Christou and J. E. Davey, J. Apple. Phys. 49, 2998 (1978), H. Krautle, P. Roentgen and H. Beneking, J. Cryst. Growth 65, 439 (1983), but, since $T_s$ is typically $>450°$ C., auto-doping of the Ge layer frequently occurs.

In one embodiment of the invention, epitaxial Ge films have been grown on (100) GaAs for $T_s$ as low as 285° C. by photodissociating GeH$_4$ (in He) at 193 nm (ArF laser). All experiments were conducted in parallel geometry (to avoid transient heating of the film and adlayer photolysis) and, in the absence of laser radiation, the films were (depending on $T_s$) amorphous or polycrystalline, or (depending on the above noted etchant step) single crystalline. The results demonstrate the ability to grow epitaxial films by LPVD under conditions in which growth is clearly not attributable to substrate heating but rather to species generated photochemically and in the gas phase.

Figure 4:
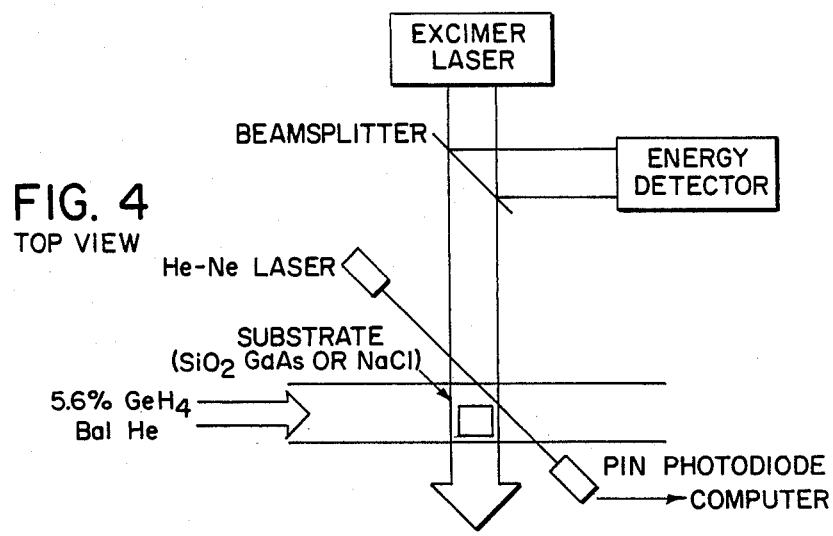
FIG. 4 is a further schematic top view of the experimental apparatus for carrying out the present invention.
Figure 5:
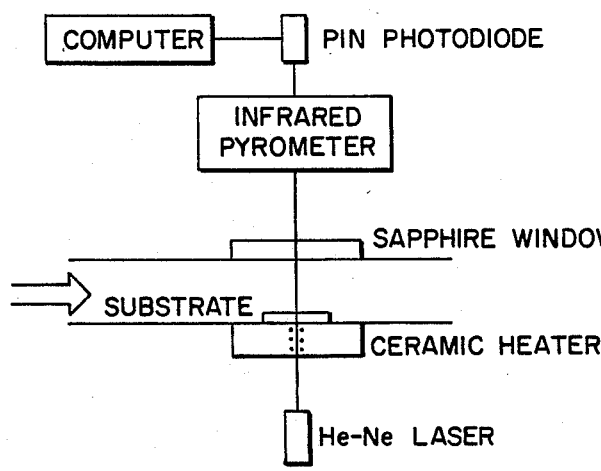
FIG. 5 is a side view of the apparatus of FIG. 4.

The experimental apparatus, FIGS. 4 and 5, is like that in K. K. King, V. Tavitian, D. B. Geohegan, E. A. P. Cheng, S. A. Piette, F. J. Scheltens and J. G. Eden, Mat. Res. Soc. Symp. Proc. 75, 189 (1987), to which further reference may be had. Constructed from commercial quartz tubing having a square (2.5×2.5 cm$^2$) cross-section, the reactor chamber was $\sim 30$ cm in length and each end was gradually tapered down to 8 mm cylindrical quartz tubing. Gas flow was electronically controlled and monitored upstream and downstream of the reactor by mass flow controllers and transducers, respectively. The beam from an excimer laser (193 nm, 40Hz) was spatially filtered by a rectangular (0.5×2.0 cm$^2$) 2.0 cm$^2$) slit, entered the reactor (transverse to gas flow) through one quartz wall (transmittance $\sim 60\%$ at 193 nm) and passed $\sim 2.2$ mm above (measured from the bottom of the beam), and parallel to, the substrate. After exiting the reactor through the opposite wall, the beam was deflected by a prism onto a pyroelectric detector (Gen—Tec) or absorbing calorimeter (Scientech) for measurements of the beam pulse energy or average power. Focusing of the laser radiation was not necessary and the energy fluence typically available above the substrate (i.e., absorption by the reactor wall accounted for) at the beginning of a growth run was $\sim 15$ mJ-cm$^{-2}$ (in a $\sim 20$ ns FWHM pulse). For the gas pressures utilized in these experiments, the distance from any point in the gaseous region above the substrate (and illuminated by the beam) to the substrate was less than one mean free path for a collision with GeH$_4$. However, it should be emphasized that photolytically produced Ge and Ge$_2$H$_6$ are collisionally stable even at much higher partial pressures of GeH$_4$.

For a given growth run, two substrates—one $\sim 5 \times 5$ mm$^2$ SiO$_2$ (quartz) and the other $0.5 \times \sim 2.0$ cm$^2$ Cr or Si doped (100) GaAs—were placed in the reactor. Both were laid on the bottom of the reactor and could be resistively-heated (by an inconel heater in a Macor glass ceramic block) to temperatures as high as 870° K. A 1 mm diameter hole drilled in the inconel heater allowed for a He-Ne laser beam to pass through the quartz substrate (subsequently detected by a pin photodiode) and thereby permit in situ measurements of film growth to be carried out in transmission. An infared pyrometer monitored the substrate temperature by viewing either the quartz or GaAs surfaces through a sapphire window sealed to the top of the reactor. The thickness of the Ge film on the GaAs substrate was also measured in situ and in real time by monitoring the interference fringes produced by infrared blackbody radiation from the GaAs substrate propagating through the growing Ge film. All data were stored on a DEC LSI 11/73 computer.

GaAs substrates were chemically cleaned by the procedure described by Anderson et. al., W. T. Anderson, Jr., A. Christou and J. E. Davey, J. Appl. Phys. 49, 2998 (1978). The quartz substrates were rinsed in spectrophotometric grade acetone and methanol and blown dry with N$_2$ prior to being introduced into the reactor chamber. The experimental procedure consisted of pre-baking the substrates at $\sim 510°$ C. under vacuum for $\sim 30$ minutes followed by dry etching at the growth temperature (285°-330° C.) by flowing a 5% HCl/He mixture (total pressure = 3.5 Torr, $\sim 50$ sccm flow rate) for 5 minutes. The latter procedure renders unnecessary the pre-baking of the substrate at much higher temperatures ($T_s > 600°$ C.). After etching the substrates, a 5% GeH$_4$ in He mixture at a total pressure of 5.6–30.4 Torr and 100 sccm mass flow rate purged the reactor for $\sim 270$ seconds. The gas pressure limits correspond to flow velocities of 40 and $\sim 6$ cm-s$^{-1}$, repectively. Subsequently, the UV laser was turned on and pulsed at 40 Hz (peak intensity $\sim 0.75$ MW-cm$^{-2}$) throughout the growth period (same gas flow conditions as in purge phase) which lasted 40–50 minutes. Film growth rates varied from $\sim 6$ to 50 Å/min, depending upon temperature and gas pressure.

Plan view and cross-sectional samples of the LPVD grown Ge/GaAs interfaces were prepared by the methods previously described by Rackham, G. M. Rackham, Ph.D. thesis, University of Bristol (1976), and Bravman and Sinclair, J. C. Bravman and R. Sinclair, Journal of Electron Microsc. Tech. 1, 53 (1984) respectively. Electron microscopy of the specimens was carried out in a Philips EM 430 microscope operating between 150 and 300 kV.

Figure 6:
FIG. 6 is a selected area electron diffraction pattern (SADP) of a laser photochemical vapor deposition (LPVD) grown Ge film indicating the presence of a Ge [100] single crystal film in addition to an amorphous layer. This film was grown at 305° C. and a $GeH_4$ partial pressure of 1.51 Torr.
Figure 7:
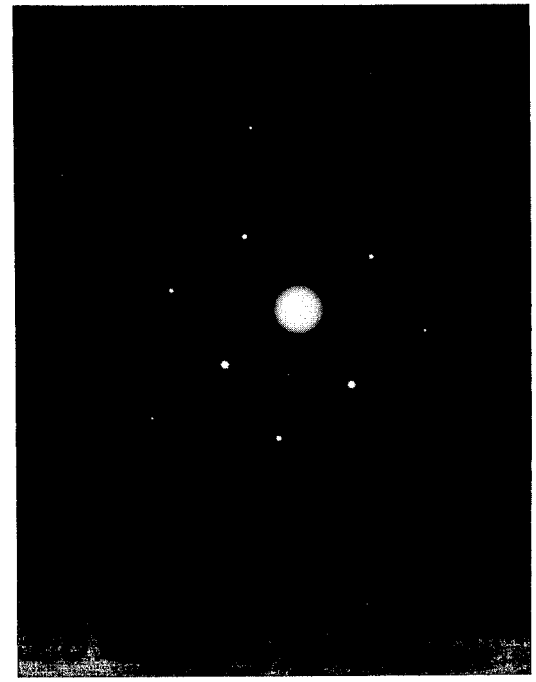
FIG. 7 is a SADP of the Ge/GaAs interface for the sample of FIG. 6, and $\underline{g}=\{200\}$ reflections characteristic of GaAs $\{100\}$ are present.

Since the plan view samples were backthinned to perforation (with a chlorine/methanol jet), TEM examination of only the LPVD grown Ge film or the entire Ge/GaAs interface was possible. FIG. 6 shows the selected area diffraction pattern (SADP) observed along the substrate normal direction from a Ge film grown at 305° C. and $P_{GeH_4/He} = 30.2$ Torr. The diffraction pattern is characteristic of that for Ge [100]single crystal. Note that $\underline{g} = \{200\}$ reflections, which are kinematically forbidden for Ge, are absent. However, diffuse rings indicating the presence of an amorphous layer are also present. Energy dispersive x-ray analysis of this region revealed only characteristic Ge peaks, indicating that the Ge overlayer consists of an amorphous layer atop an epitaxial single crystal film. A similar SADP for the Ge/GaAs interface is displayed in FIG. 7 which reveals a superposition of a GaAs [100]pattern (with $\underline{g} = \{200\}$ reflections now evident), the Ge [100]diffraction pattern (observed in FIG. 6), and weak diffuse rings from a thin amorphous Ge layer.

Figure 8:
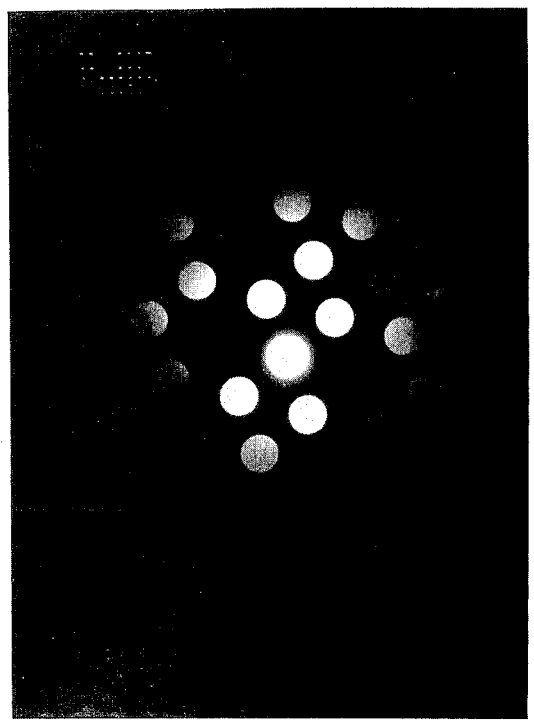
FIG. 8 is a convergent beam diffraction pattern of the Ge film in FIG. 6 acquired with a 150 Å electron probe. Nearly identical patterns are obtained for all of the LPVD films grown in the 285°–330° C. interval.
Figure 9:
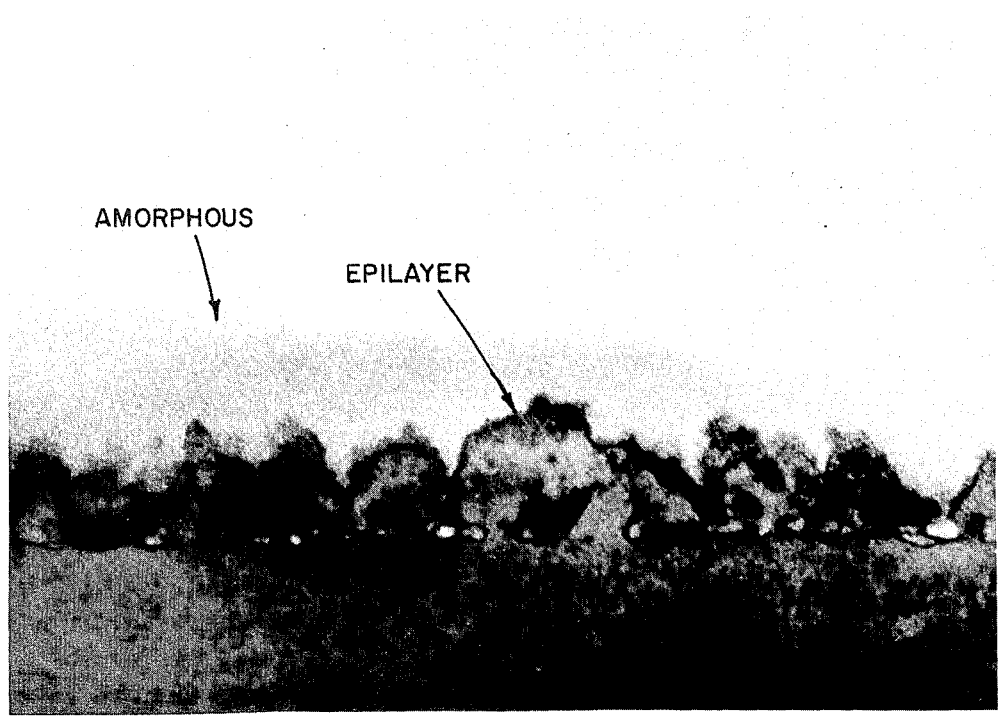
FIG. 9 is a cross-sectional image of the Ge/GaAs interface (examined in FIGS. 6–8) showing a 250–350 Å thick crystalline film and ~600 Å thick amorphous layer.

FIG. 8 shows a [100] convergent beam pattern from the Ge film of FIG. 6 that was acquired with a 150 Å A electron probe. Once again, the $\underline{g} = \{200\}$ discs are absent and the fact that no symmetry information is visible within the discs indicates that the epitaxial Ge film is thin ($\sim$ few hundred A). Cross-sectional images of the sample examined in FIGS. 6-8 confirm the supposition that the Ge film initially grows epitaxially but later switches to amorphous material. As shown in FIG. 9, the crystalline Ge layer varies from 250–350 Å A in thickness and the amorphous Ge film is $\sim 600$ Å A thick. Convergent beam electron diffraction studies of both plan view and cross-sectional samples demonstrate that the crystalline Ge film has the following epitaxial relationship with the substrate:

Ge [100]//GaAs [100]; Ge [010]// GaAs [010].

The $\sim 30$ Å roughness of the GaAs substrate surface evident in FIG. 9 is an artifact of the in-situ HCl etch process. Also, the existence of several inclined growth defects in the Ge epi layer, which appear to propagate from the Ge/GaAs interface, are apparent in FIG. 9. Finally, lattice images of the GaAs/crystalline Ge interface, taken along [011] GaAs at 300 kV, show two sets of 111 lattice fringes running continuously from the GaAs substrate into the Ge crystalline layer, thus illustrating the epitaxy between the two crystals.

The TEM results of FIGS. 6-9 are representative of the observations made of three other LPVD grown films. To date, the lowest substrate temperature at which epitaxial Ge films have been grown is 285° C. Typically, the epi Ge layer grows at a rate of 4–6 nm/min (up to $\sim 1$ Å–s$^{-1}$) until reaching an average thickness of 400–500 Å. (The film shown in cross-sectional view in FIG. 9 is thinner because, for only this particular run, the HCl etchant was flowed during growth). No obvious difference, other than a slight increase in the film growth rate, was observed when increasing the GeH$_4$/He pressure from 5 to 30 Torr. Also, no apparent improvement in the film morphology or structure was detected if the film was etched during growth. However, failure to etch the substrate prior to film growth resulted only in amorphous Ge films.

In the absence of UV radiation (i.e., conventional CVD), films grown at 300°-310° C. are completely amorphous while those grown at higher temperatures (415 ° C.) are heavily defected polycrystalline material (microtwinning, dislocations and stacking faults).

From the TEM cross-sectional studies, it appears that the Ge initially nucleates on the substrate as epitaxial islands which subsequently grow in size and eventually coalesce to form a film. The switch from epitaxial to amorphous material occurs immediately after coalescence (t~400-500 Å). The difficulty apparently lies in the limited adatom mobility at these low surface temperatures and nonthermal approaches to improving the mobility of Ge adatoms will almost certainly allow for continuous epitaxial Ge films to be grown at even lower temperatures.

In summary, epitaxial Ge films have been grown on [100] GaAs by photodissociating $GeH_4$ ~2~3mm above the substrate for $T_s$ as low as 285° C. The high flow velocities (6-40 cm-s$^{-1}$) and low partial gas pressures in these experiments suppress homogeneous nucleation and ensure that atoms (or $Ge_2H_6$) produced photochemically via 193 nm absorption reach the substrate without (on average) suffering a collision with background $GeH_4$. These results clearly demonstrate the ability of a UV laser to produce highly non-equilibrium concentrations of atomic or molecular species, thereby altering the reactor chemistry so as to permit the low temperature growth of epitaxial semiconductor films.

Portions of the invention are reported in our above noted published article, King et al, Mat. Res. Soc. Symp. Proc. 75, 189 (1987), to which further reference is now made, and which is incorporated herein. The photochemical growth of polycrystalline and amorphous Ge films on $SiO_2$, GaAs and NaCl by photodissociating $GeH_4$ with excimer laser radiation in parallel geometry is reported. For substrate temperatures ($T_s$) below the pyrolytic threshold for $GeH_4$ (553K), two distinct regions of film growth are observed. In the $425 < T_s < 553K$ range, the ultraviolet (UV) laser "seeds" the reactor with $Ge_2H_6$ which readily pyrolyzes at the surface, forming several monolayers of Ge which subsequently catalyze the pyrolysis of $GeH_4$. The activation energy ($E_a$) in this region is the same as that for the normal CVD growth of Ge from $GeH_4$ ($E_a \simeq 0.9$ eV). If, however, the laser is pulsed throughout the film growth run, $E_a$ falls by a factor of at least 2 and growth is observed for $T_s$ as low as 300K. In this laser sustained region, film growth ceases in the absence of UV laser radiation. These results clearly demonstrate the ability of a UV laser to alter the reactor chemistry and dictate the species responsible for film growth.

Vapor phase photochemical reactions are capable of producing nonequilibrium number densities of atomic and molecular species in a CVD reactor. In particular, one can selectively create (in situ) transient species that are not normally present in a conventional reactor. Consequently, the growth conditions in the reactors can be altered artificially. The implications of such capabilities are significant for the low temperature growth of metal and semiconductor films. Devices based on the temperature sensitive III-V compounds (such as the Ge/GaAs heteroepitaxial system), in particular, would benefit from reduced temperature operation owing to reductions in the out-diffusion of Column V atoms and minimal impurity redistribution.

Andreatta and coworkers, R. W. Andreatta, C. C. Abele, J. F. Osmundsen, J. G. Eden, D. Lubben and J. E. Greene, Appl. Phys. Lett. 40, 183 (1982), J. G. Eden, J. E. Greene, J. F. Osmundsen, D. Lubben, C. C. Abele, S. Gorbatkin and H. D. Desai, *Laser Diagnostics and Photochemical Processing for Semiconductor Devices,* Mat. Res. Soc. Symp. Proc., Vol. 17, R. M. Osgood, S. R. J. Brueck and H. R. Schlossberg, eds. (North-Holland, N.Y., 1983), pp. 185-192, have reported the photochemical growth (LPVD: laser photochemical vapor deposition) of Ge films on $SiO_2$, 1102 sapphire and NaCl by photodissociating $GeH_4$ at 193 (ArF laser) or 248 nm (KrF). In these experiments, the excimer laser beam irradiated the substrate at normal incidence and polycrystalline films were grown at substrate temperatures as low as 300° K. In subsequent spectroscopic studies, Osmundsen et al., J. F. Osmundsen, C. C. Abele and J. G. Eden, J. Appl. Phys. 57, 2921 (1985), demonstrated that, for $\lambda = 248$ nm, the Ge film growth process is initiated by the two photon dissociation of $GeH_4$ to yield the germylene radical, $GeH_2$. Although the experiments showed that $GeH_4$ and hydrogen atoms are produced immediately, kinetic analysis, J. F. Osmundsen, C. C. Abele and J. G. Eden, J. Appl. Phys. 57, 2921 (1985), of the ensuing collision sequence identified digermane ($Ge_2H_6$) and atomic Ge itself as the dominant (long-term) "stable" by-products of the photolysis of $GeH_4$. In this context, it is interesting that the potential importance of disilane ($Si_2H_6$) to the growth of a-Si:H films was inferred from experiments reported by T. Taguchi, M. Morikawa, Y. Hiratsuka and K. Toyoda, Appl. Phys. Lett. 49, 971 (1986).

In the present experiments, polycrystalline and amorphous Ge films were grown photochemically by photodissociating $GeH_4$ at 193 or 248 nm in a parallel configuration (i.e., the laser beam does not irradiate the substrate). For temperatures below pyrolytic threshold (T=553K), L. N. Hall, J. Electrochem. Soc. 119, 1593 (1972) and references cited therein, two distinct modes of film growth are observed and attributed to separate gas phase species. The results clearly show that the ultraviolet (UV) laser is capable of controlling the reactor chemistry and so determine the atomic or molecular species that is responsible for film growth.

In the experimental apparatus, FIGS. 4 and 5, the beam from an excimer laser passed through a rectangular (0.5×2.0 cm$^2$) slit and entered a quartz reactor having a square cross-section (2.5×2.5 cm$^2$, ~30 cm in length). Although the UV laser beam was not focused, the beam intensity in the reactor was easily varied from 0.1 to ~1.3 MW-cm$^{-2}$ by adjusting the thyratron charging voltage or inserting quartz flats in the beam path. Pulse energies and the average laser power were measured by pyroelectric (Gen—Tec) or absorbing calorimeter (Scientech) detectors, and the laser energy actually entering the cell was measured by determining the transmission of the cell walls with the reactor evacuated. The substrate (quartz, GaAs or NaCl—typically ~0.4 cm$^2$ area) lay on the bottom of the reactor and was resistively heated. Substrate temperatures as high as ~870K could be obtained and the NaCl substrates were prepared by cleaving large crystals in argon. The excimer laser beam passed over and parallel to the substrate. Although the distance from the center of the beam to the substrate surface could be adjusted from 0 to 25 mm, all of the data reported here were acquired at a height of 2.2 mm. Care was taken to ensure that the excimer laser beam did not irradiate the substrate.

Figure 10:
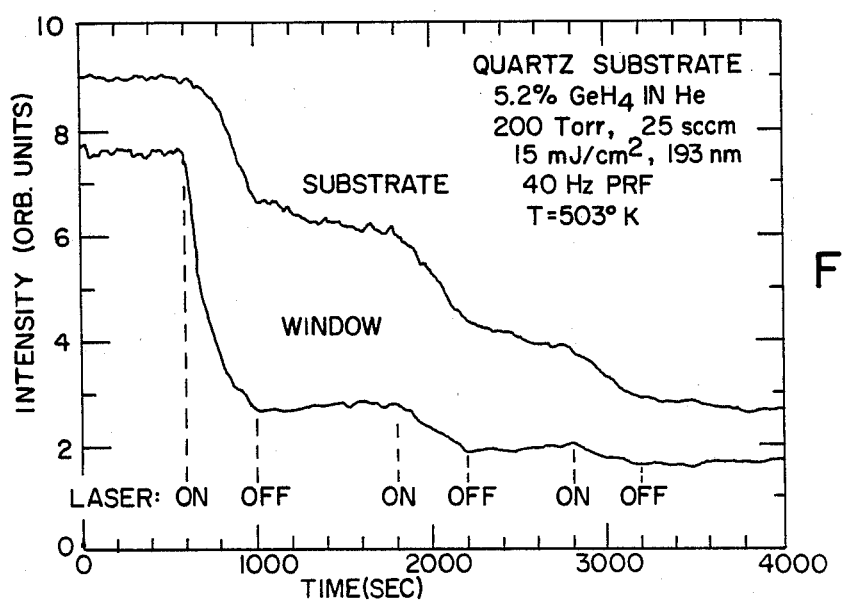
FIG. 10 shows He—Ne laser transmission curves illustrating the growth of Ge films on an $SiO_2$ substrate and on the wall where the eximer laser enters the reactor chamber. The film growth at the entrance window does not occur in the absence of UV laser radiation, but growth on the substrate is clearly more noticeable.

A 1 mm diameter hole drilled in the inconel heater allowed for the passage of a He-Ne laser beam through quartz substrates and so the thickness of growing Ge films was measured in situ. The growth of thin Ge films on the window through which the excimer radiation entered the cell attenuated the UV laser beam, making it necessary to measure the film growth rate at that point with a second He—Ne laser. An infrared pyrometer monitored the substrate temperature by viewing the substrate through a sapphire window at the top of the reactor. In order to ensure that the pyrometer monitored the same region of the region of the substrate that was viewed by the He—Ne probe, the IR pyrometer was aligned by that red laser beam. He—Ne laser transmission data and the substrate temperature were stored by a DEC LSI 11/73 computer. Gas pressure and flow in the reactor were simultaneously controlled electronically FIG. 10 displays Ge film growth curves (laser transmission through growing film versus time) that are representative of those obtained in these experiments. For a substrate temperature of 500K, no film growth occurs at the substrate or the entrance window (reactor side wall where beam enters) before the laser is turned on. In the presence of 193 nm radiation (laser PRF=40 Hz, initial fluence=15 mJ-cm$^{-2}$), growth at the substrate and entrance window commences, although the substrate growth rate is considerably slower than that at the window. After the laser is later turned off, film growth at the window stops completely while substrate growth continues, but much slower than before. That is, in a restricted temperature region below the pyrolytic temperature for GeH$_4$ ($T_p \simeq 553K$), L. N. Hall, J. Electrochem. Soc. 119, 1593 (1972) and references cited therein, where CVD film growth does not normally occur, UV laser radiation is capable of initiaing ("triggering") the growth of Ge films from GeH$_4$. The laser is, in other words, not necessary to sustain film growth in this temperature range. For substrate temperatures well below that given in FIG. 10 (i.e., $T_s \lesssim 425K$), film growth at the substrate also stops when the UV radiation is blocked.

Both "modes" of film growth, laser initiated and laser sustained, are depicted in the Arrhenius plot of FIG. 11. Above 553K, conventional CVD growth of Ge films (from 5.2% GeH$_4$ in He) on SiO$_2$ (quartz) occurs. The activation energy in this region ($E_a \simeq 0.90$ eV) is in accord with previous measurements, L. N. Hall, J. Electrochem. Soc. 119, 1593 (1972) and references cited therein. As mentioned earlier, for $425 \lesssim T_s \lesssim 553K$, Ge film growth can be initiated by irradiating the gaseous region above the substrate with a train of UV laser pulses. In practice, a fixed number of 15 ns FWHM, 15 mJ-cm$^{-2}$ pulses were admitted to the reactor after which the laser was turned off. Subsequently, film growth continued indefinitely. Because the minimum number of pulses required to initiate film growth was found to rise rapidly with decreasing $T_s$, the film growth rates given in FIG. 11 for this region were not measured until the laser was extinguished. Not suprisingly, the activation energy that best describes these data is the same as that observed above the pyrolytic threshold.

The logical interpretation of these results is that the laser locally "seeds" the reactor with Ge$_2$H$_6$ which is a known by-product of the photodissociation of GeH$_4$, J. F. Osmundsen, C. C. Abele and J. G. Eden, J. Appl. Phys. 57, 2921 (1985). In contrast to the work described in the immediately above Osmundsen et al article at 248 nm, the photodissociation of GeH$_4$ at 193 nm appears to require only the absorption of a single photon, yielding GeH$_3$. The formation of Ge$_2$H$_6$ subsequently proceeds by the reaction:

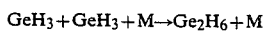

GeH$_3$+GeH$_3$+M→Ge$_2$H$_6$+M where M is any third body (such as a He background atom). Similar conclusions were reached in experiments in which matrix-isolated GeH$_4$ was photolyzed in the VUV, G. R. Smith and W. A. Guillory, J. Chem. Phys. 56, 1423 (1972). The hydrogen atom produced in the initial photolysis of GeH$_4$ is also effective in producing germyl radicals, J. F. Osmundsen, C. C. Abele and J. G. Eden, J. Appl. Phys. 57, 2921 (1985), G. R. Smith and W. A. Guillory J. Chem. Phys. 56, 1423 (1972), in SiH$_4$K. Nakamura, N. Masaki, S. Sato and K. Shimokoshi, J. Chem. Phys. 83, 4504 (1985), E. R. Austin and F. W. Lampe, J. Phys. Chem. 81, 1134 (1977). Further support for associating digermane with the laser-initiated film growth region lies in the minimum temperature ($T_p$) required to pyrolyze the molecule.

Preliminary experiments by others conducted with pure Ge$_2$H$_6$ indicate that $T_p$ for this molecule is ~460K. This result is consistent with the initial measurements of the lower temperature limit ($T_s \lesssim 460K$) of the laser-initiated growth regime at a system pressure of 200 Torr. Improvements in the minimum detectable growth rate along with variations of the system pressure and flow rate allowed for laser-initiated growth to be subsequently demonstrated for $T_s$ as low as ~425° K.

As noted by Tsao and Ehrlich, J. Y. Tsao and D. J. Ehrlich, Appl. Phys. Lett. 45, 617 (1984), "The initiation of chemical vapor deposition (CVD) is known to be sensitive, in many cases, to the starting surface. This sensitivity, which often takes the form of a nucleation barrier ... " In the work of the immediately above Tsao et al article, and experiments reported by Higashi and Fleming, G. S. Higashi and C. G. Fleming, Appl. Phys. Lett. 48, 1051 (1986), it was demonstrated that several photo-deposited monolayers of Al catalyzed the pyrolysis of triisobuylaluminum to grow aluminum strips. It appears that a similar process is occurring here. The major difference is that the ArF laser produces Ge$_2$H$_6$ in the vapor phase (not at the surface) which subsequently pyrolyzes (not photodissociates) at the substrate. It is clear that the few monolayers of Ge resulting from the pyrolysis of Ge$_2$H$_6$ are more catalytically active than the original surface and are able to promote or catalyze the decomposition of GeH$_4$. Thus, the lower temperature limit of the laser-initiated region in FIG. 11 appears to be the pyrolytic temperatue for Ge$_2$H$_6$ on SiO$_2$ and not the limit for pyrolysis of GeH$_4$ on Ge.

Taguchi and coworkers, T. Taguchi, M. Morikawa, Y. Hiratsuka and K. Toyoda, Appl. Phys. Lett. 49, 971 (1986), have suggested the importance of Si$_2$H$_6$ in the growth of a—Si:H films grown on glass at 623K. The role of disilane was inferred from the thickness of films grown for a fixed "run" time with the laser on throughout the growth period. The beneficial effect of Si$_2$H$_6$ was attributed to excitation transfer from Si$_2$H$_6$ to SiH$_4$. The experiments reported here suggest that an alternative explanation is the pyrolysis of Si$_2$H$_6$ at the substrate followed by catalytic decomposition of monosilane. In summary, the laser initiated region in FIG. 11 appears to arise from the pyrolysis of laser-produced Ge$_2$H$_6$ at the SiO$_2$ substrate and the subsequent Ge film-catalyzed decomposition of GeH$_4$.

If the UV laser is pulsed throughout the film growth run, dramatic changes in the growth process are observed. Detailed measurements of the Ge film growth rate (for various pressures and flow rates) in the region of $T_s < T_p$ consistently show the two growth modes shown in FIG. 11. However, $E_a$ of the laser-sustained process does vary with pressure and flow. Therefore, while it is not presently possible to be dogmatic as to the identity of the species responsible for film growth in the laser-sustained region, it can be concluded that this species is neither $Ge_2H_6$ nor $GeH_4$. In summary, we note that:

(1) Specular Ge films can be grown down to room temperature in the parallel configuration (i.e., no laser heating of substrate).

(2) Two modes of film growth are obtained, depending on whether the ArF laser is pulsed throughout the run or not. The laser-initiated mode is attributed to photochemical production of $Ge_2H_6$ which pyrolyzes at $T_s$ as low as $\sim$463° K. The presence of several Ge monolayers on the $SiO_2$ substrate catalyzes the decomposition of $GeH_4$. If the laser is "on" throughout the run, the activation energy decreases by at least a factor of two and is believed to arise from a photofragment of $GeH_4$.

Other experimental evidence also points to the photochemical origin of both the laser initiated and laser sustained growth of Ge. Not only does the UV laser beam not strike the substrate, but a strong wavelength dependence to the film growth rate is observed. While film growth does weakly occur for $\lambda=248$ nm, nothing is observed when $\lambda=277$ nm (first Stokes of 248 nm Raman scattered in $H_2$). Thus one concludes that the photon energy necessary to initiate the photochemical chain (two photon dissociation of $GeH_4$) lies between 4.5 and 5.0 eV.

Transmission electron micrographs of films grown (on NaCl) in the 473-553K region show the films to be amorphous at the low end of this interval and polycrystalline at the higher temperatures.

In summary, the growth of Ge films on various substrates by photodissociating $GeH_4$ at 193 nm clearly demonstrates the ability of external UV radiation to produce highly nonequilibrium concentration of radicals in the reactor and thus affect the chemical kinetics and growth rates of thin semiconductor films.

It is recognized that various equivalents, alternatives and modifications are possible within the scope of the appended claims.

We claim:

1. A semiconductor processing method comprising providing a gas and providing a substrate at a temperature below the pyrolytic threshold of said gas and photodissociating said gas to a species which pyrolyzes at the surface of said substrate forming several monolayers of catalytically active material for semiconductor deposition, wherein deposition of said semiconductor material is triggered by laser radiation, and continues by chemical vapor deposition.

2. A semiconductor processing method for growing a semiconductor film from a semiconductor-bearing gas on a substrate at a substrate temperature below the pyrolytic threshold of said gas comprising photodissociating said gas to a species which pyrolyzes at the surface of said substrate and forms several monolayers of semiconductor material which subsequently catalyze decomposition of said gas, wherein deposition of said semiconductor material is triggered by laser radiation, and continues by chemical vapor deposition.

3. The invention according to claim 2 comprising transporting said species entirely in the gas phase the full distance from the point of said photodissociation to said substrate surface.

4. The invention according to claim 3 comprising photodissociating said gas to said species at a point spaced above said substrate by a distance at least about two orders of magnitude greater than the mean free collision path of molecules in said gas such that said species must be stable against at least hundreds of collisions and live long enough to reach said substrate surface.

5. The invention according to claim 4 wherein said gas, prior to said photodissociation to said species, is chemically inactive relative to said substrate.

6. A semiconductor processing method for growing a semiconductor film on a substrate by chemical vapor deposition at substrate temperatures below those normally necessary for chemical vapor deposition, comprising providing a region of gas with semiconductor-bearing molecules above said substrate and photodissociating said semiconductor-bearing molecules in the gas phase with laser radiation to photofragments which migrate in the gas phase to said substrate and decompose to form several initial monolayers of semiconductor material which are more catalytically active than said substrate itself, whereafter said semiconductor material continues to grow on said initial monolayers by chemical vapor deposition from said gas at substrate temperatures below those normally required for chemical vapor deposition, wherein deposition of said semiconductor material is triggered by laser radiation, and continues by chemical vapor deposition.

7. The invention according to claim 6 wherein said semiconductor film growth is triggered by said laser radiation, and continues after said laser radiation is terminated.

8. A semiconductor processing method comprising:
providing a chamber capable of receiving semiconductor-bearing gas;
placing a substrate having a top planar surface in said chamber;
introducing semiconductor-bearing gas into said chamber at a given pressure and flow rate;
introducing laser radiation into said chamber along a path parallel to said top planar surface of said substrate and spaced above said substrate by a distance at least about two orders of magnitude greater than the mean free collision path of molecules in said gas, said laser radiation having a given wavelength and intensity to photochemically convert said gas to a photodissociated collisionally stable species for gas phase transport to said substrate, said species surviving hundreds of collisions enroute in the gas phase to said substrate through said distance at least about two orders of magnitude greater than said means free collision path, said stable species living long enough to reach said substrate, said stable species reacting with said substrate to produce a catalytic species catalytically active relative to said gas to catalyze decomposition of said gas to form a layer of semiconductor material on said substrate, wherein deposition of said semiconductor material is triggered by laser radiation, and continues by chemical vapor deposition.

9. The invention according to claim 8 comprising selecting a proper combination of laser intensity, gas pressure and gas flow rate to provide gas phase transport of said photodissociated species through the full distance to said substrate.

10. The invention according to claim 8 comprising selecting a proper combination of laser intensity, gas pressure and gas flow rate such that said gas is photochemically converted to said collisionally stable species by multi-photon excitation, wherein each molecule of said gas absorbs more than one photon.

11. The invention according to claim 8 wherein said laser radiation triggers said photochemical conversion of said gas but is not necessary to said catalyzed decomposition of said gas by said catalytic species such that said layer of semiconductor material continues to be formed even if said laser radiation is terminated.

12. The invention according to claim 8 wherein said stable species has pyrolytic threshold less than that of said gas, and comprising heating said substrate by a source other than said laser radiation to a temperature greater than the pyrolytic threshold of said stable species and less than the pyrolytic threshold of said gas, such that said stable species is photochemically converted from said gas by said laser radiation and gas phase transported without pyrolytic reaction to said substrate, whereafter said stable species is pyrolyzed by said substrate to said catalytic species.

13. A semiconductor processing method comprising:
providing a chamber capable of receiving semiconductor-bearing gas;
placing a substrate having a top planar surface in said chamber;
controlling the temperature of said substrate to a given temperature;
introducing a semiconductor-bearing gas into said chamber at a partial pressure greater than about 0.5 Torr and introducing a rare gas into said chamber such that the total pressure of gas in said chamber is greater than about 20 Torr and at a flow rate greater than about 100 cubic centimeters per minutes;
introducing laser radiation into said chamber along a path parallel to said top planar surface of said substrate and spaced above said substrate by a distance at least about two orders of magnitude greater than the mean free collision path of molecules in said gas, said laser radiation having a given wavelength corresponding to the photodissociation energy of said semiconductor-bearing gas and having a peak intensity of at least several megawatts per square centimeter to photochemically convert said gas to a photodissociated collisionally stable species for gas phase transport to said substrate, said stable species having a pyrolytic threshold less than that of said semiconductor-bearing gas, said temperature of said substrate being controlled to a temperature greater than the pyrolytic threshold of said stable species and less than the pyrolytic threshold of said semiconductor-bearing gas, said stable species being photochemically converted and gas phase transported without pyrolytic reaction and surviving hundreds of collisions enroute in the gas phase to said substrate through said distance at least two orders of magnitude greater than said mean free collision path to reach said substrate, whereafter said stable species is pyrolyzed by said substrate to said catalytic species catalytically active relative to said semiconductor-bearing gas to catalyze decomposition of said semiconductor-bearing gas to form a layer of semiconductor material on said substrate, wherein deposition of said semiconductor material is triggered by laser radiation, and continues by chemical vapor deposition.

14. A single crystalline semiconductor processing method comprising:
providing a chamber capable of receiving various gases;
placing a semiconductor substrate having a top planar surface in said chamber;
introducing an etchant-bearing gas into said chamber and flowing such etchant-bearing gas over said substrate to etch the latter and remove surface impurities;
evacuating said etchant-bearing gas from said chamber;
introducing a semiconductor-bearing gas and a rare gas into said chamber at a given pressure and flow rate;
introducing laser radiation into said chamber along a path parallel to said top planar surface of said substrate and spaced above said substrate by a distance at least two orders of magnitude greater than the mean free collision path of molecules in said semiconductor-bearing gas, said laser radiation photochemically converting said semiconductor-bearing gas to a photodissociated, collisionally stable species for gas phase transport to said substrate, said stable species having a pyrolytic threshold less than that of said semiconductor-bearing gas, said species surviving hundreds of collisions enroute in the gas phase to said substrate through said distance at least two orders of magnitude greater than said mean free collision path, said stable species being transported in the gas phase without pyrolytic reaction to said substrate, said stable species reacting with said substrate to produce a catalytic species catalytically active relative to said semiconductor-bearing gas to catalyze decomposition of said semiconductor-bearing gas to epitaxially grow a layer of single crystal semiconductor material on said semiconductor substrate, wherein deposition of said semiconductor material is triggered by laser radiation, and continues by chemical vapor deposition.

15. The invention according to claim 14 comprising selecting a proper combination of pressure and flow rate of said semiconductor-bearing and rare gases and intensity of said laser radiation to photodissociate said semiconductor-bearing gas to said species which is stable against collisions and which migrates the full distance to said substrate, and comprising controlling said temperature of said substrate by a source other than said laser radiation to a temperature greater than the pyrolytic threshold of said stable species and less than the pyrolytic threshold of said semiconductor-bearing gas such that said stable species is pyrolyzed by said substrate to epitaxially grow several monolayers of single crystalline semiconductor material which catalyzes decomposition of said semiconductor-bearing gas to in turn provide single crystalline epitaxial semiconductor growth.

16. A semiconductor processing method for growing a semiconductor film from a semiconductor-bearing gas on a substrate at a substrate temperature below the pyrolytic threshold of said gas comprising photodissociating said gas to a collisionally stable species and transporting said species in the gas phase the full distance from the point of said photodissociation to said substrate surface for growth of said semiconductor film, wherein deposition of said semiconductor material is triggered by laser radiation, and continues by chemical vapor deposition.

17. The invention according to claim 16 comprising photodissociating said gas to said collisionally stable species at a point spaced above said substrate by a distance at least about two orders of magnitude greater than the mean free collision path of molecules in said gas such that said species must be stable against at least hundreds of collisions and live long enough to reach said substrate surface.

18. A semiconductor processing method for growing a semiconductor film on a substrate by chemical vapor deposition at substrate temperatures below those normally necessary for chemical vapor deposition, comprising providing a region of gas with semiconductor-bearing molecules above said substrate and photodissociating said semiconductor-bearing molecules in the gas phase with laser radiation to collisionally stable photofragments which migrate in the gas phase to said substrate to form several initial monolayers of semiconductor material which are more catalytically active than said substrate itself, whereafter said semiconductor material continues to grow on said initial monolayers by chemical vapor deposition from said gas at substrate temperatures below those normally required for chemical vapor deposition, wherein deposition of said semiconductor material is triggered by laser radiation, and continues by chemical vapor deposition.

19. A semiconductor processing method comprising:
providing a chamber capable of receiving semiconductor-bearing gas;
placing a substrate having a top planar surface in said chamber;
introducing semiconductor-bearing gas into said chamber at a given pressure and flow rate;
introducing laser radiation into said chamber along a path parallel to said top planar surface of said substrate and spaced above said substrate by a distance at least about two orders of magnitude greater than the mean free collision path of molecules in said gas, said laser radiation having a given wavelength and intensity to photochemically convert said gas to a photodissociated collisionally stable species for gas phase transport to said substrate, said species surviving hundreds of collisions enroute in the gas phase to said substrate through said distance at least about two orders of magnitude greater than said mean free collision path, said stable species living long enough to reach said substrate and form a layer of semiconductor material on said substrate, wherein deposition of said semiconductor material is triggered by laser radiation, and continues by chemical vapor deposition.

20. The invention according to claim 19 comprising selecting a proper combination of laser intensity, gas pressure and gas flow rate to provide gas phased transport of said photodissociated collisionally stable species through the full distance to said substrate.

21. The invention according to claim 19 comprising selecting a proper combination of laser intensity, gas pressure and gas flow rate such that said gas is photochemically converted to said collisionally stable species by multi-photon excitaton, wherein each molecule of said gas absorbs more than one phototon.

22. A semiconductor processing method comprising:
providing a chamber capable of receiving semiconductor-bearing gas;
placing a substrate having a top planar surface in said chamber;
controlling the temperature of said substrate to a given temperature;
introducing a semiconductor-bearing gas into said chamber at a partial pressure greater than about 0.5 Torr and introducing a rare gas into said chamber such that the total pressure of gas in said chamber is greater than about 20 Torr and at a flow rate greater than about 100 cubic centimeters per minute;
introducing laser radiation into said chamber along a path parallel to said top planar surface of said substrate and spaced above said substrate by a distance at least about two orders of magnitude greater than the mean free collision path of molecules in said gas, said laser radiation having a given wavelength corresponding to the photodissociation energy of said semiconductor-bearing gas and having a peak intensity of at least several megawatts per square centimeter to photochemically convert said gas to a photodissociated collisionally stable species for gas phase transport to said substrate, said stable species being photochemically converted and gas phase transported without pyrolytic reaction and surviving hundreds of collisions enroute in the gas phase to substrate through said distance at least two orders of magnitude greater than said mean free collision path to reach said substrate for semiconductor film growth, wherein deposition of said semiconductor material is triggered by laser radiation, and continues by chemical vapor deposition.

* * * * *